(12) United States Patent
Nakayama et al.

(10) Patent No.: US 10,585,123 B2
(45) Date of Patent: Mar. 10, 2020

(54) DETECTION OF FALSE DATA INJECTION ATTACKS IN POWER SYSTEMS USING MULTIPLEX INVARIANT NETWORKS AND DOMAIN KNOWLEDGE

(71) Applicant: NEC Laboratories America, Inc., Princeton, NJ (US)

(72) Inventors: Kiyoshi Nakayama, Santa Clara, CA (US); Chenrui Jin, Cupertino, CA (US); Ratnesh Sharma, Fremont, CA (US); Nikhil Muralidhar, Fairfax, VA (US)

(73) Assignee: NEC Corporation (JP)

( * ) Notice: Subject to any disclaimer, the term of this patent is extended or adjusted under 35 U.S.C. 154(b) by 0 days.

(21) Appl. No.: 16/151,544

(22) Filed: Oct. 4, 2018

(65) Prior Publication Data
US 2019/0113549 A1    Apr. 18, 2019

Related U.S. Application Data

(60) Provisional application No. 62/615,980, filed on Jan. 11, 2018, provisional application No. 62/572,006, filed on Oct. 13, 2017.

(51) Int. Cl.
*G01R 19/25* (2006.01)
*G06F 17/16* (2006.01)
(Continued)

(52) U.S. Cl.
CPC ......... *G01R 19/2513* (2013.01); *G06F 17/16* (2013.01); *G06K 9/72* (2013.01); *G06Q 50/06* (2013.01)

(58) Field of Classification Search
CPC ...... G01R 19/2513; G06F 17/16; G06K 9/72; G06Q 50/06
(Continued)

(56) References Cited

U.S. PATENT DOCUMENTS

| | | | |
|---|---|---|---|
| 2014/0047279 A1* | 2/2014 | Sharma | G06F 11/079 714/39 |
| 2016/0011005 A1* | 1/2016 | Wang | G01D 4/002 340/870.02 |
| 2018/0234447 A1* | 8/2018 | Mueen | G06Q 50/01 |

OTHER PUBLICATIONS

Liu, "False Data Injection Attacks Against State Estimation in Electric Power Grids", ACM Transactions on Information and System Security (TISSEC), vol. 11, No. 1, Article 13, May 2011, pp. 1-33.

(Continued)

*Primary Examiner* — Omar Casillashernandez
(74) *Attorney, Agent, or Firm* — Joseph Kolodka

(57) ABSTRACT

A computer-implemented method, system, and computer program product are provided for anomaly detection in a power system. The method includes receiving, by a processor-device, a plurality of measurements from a plurality of meters throughout the power system. The method also includes generating, by the processor-device, temporal causal networks based on pair-wise relationships between the plurality of measurements from the plurality of meters over time. The method additionally includes determining, by the processor-device, invariant relationships for the plurality of meters between the temporal causal networks. The method further includes predicting, by the processor-device, an anomaly from the invariant relationships for the plurality of meters with a residual anomaly threshold. The method also includes disabling one of the plurality of meters that originated the anomaly.

20 Claims, 4 Drawing Sheets

(51) Int. Cl.
    *G06K 9/72*     (2006.01)
    *G06Q 50/06*    (2012.01)
(58) Field of Classification Search
    USPC .......................................................... 340/657
    See application file for complete search history.

(56)            References Cited

OTHER PUBLICATIONS

Deng, "Defending Against False Data Injection Attacks on Power System State Estimation", IEEE Transactions on Industrial Informatics, vol. 13, Issue 1, Feb. 2017, pp. 198-207.
Bobba, "Detecting False Data Injection Attacks on DC State Estimation", First Workshop on Secure Control Systems, CPSWEEK, Mar. 2010, pp. 1-9.
Liu, "Detection of False Data Injection in Power Grid Exploiting Low Rank and Sparsity", IEEE International Conference on Communications (ICC), Jun. 2013, pp. 1-5.
Lee, "Towards Real-World Complexity: An Introduction to Multiplex Networks", The European Physical Journal B, Feb. 2015, pp. 1-20.
Jiang, "Discovering Likely Invariants of Distributed Transaction Systems for Autonomic System Management", IEEE International Conference on Autonomic Computing, Jun. 2006, pp. 199-208.
Sharma, "Fault Detection and Localization in Distributed Systems Using Invariant Relationships", IEEE/IFIP International Conference on Dependable Systems and Networks, Jun. 2013, pp. 1-8.

\* cited by examiner

200

```
┌─────────────────────────────────────────────────┐
│   Model Pair-wise Component Relationships       │
│                    210                          │
│   ┌─────────────────────────────────────────┐   │
│   │       Generate Causality Graphs         │   │
│   │                 212                     │   │
│   └─────────────────────────────────────────┘   │
└─────────────────────────────────────────────────┘
                        │
                        ▼
┌─────────────────────────────────────────────────┐
│         Learn Temporal Causal Network $G$        │
│                    220                          │
│   ┌─────────────────────────────────────────┐   │
│   │ $X_j$ has a relationship of predictive   │   │
│   │          causality with $X_i$            │   │
│   │                 222                     │   │
│   └─────────────────────────────────────────┘   │
└─────────────────────────────────────────────────┘
                        │
                        ▼
┌─────────────────────────────────────────────────┐
│  Incorporate non-linear system states through   │
│      a deep robust autoencoder mechanism.       │
│                    230                          │
└─────────────────────────────────────────────────┘
                        │
                        ▼
┌─────────────────────────────────────────────────┐
│ Calculate predictions of model $K_{ij}$ at each  │
│               time step $t$                      │
│                    240                          │
└─────────────────────────────────────────────────┘
                        │
                        ▼
┌─────────────────────────────────────────────────┐
│    Adopt a residual based anomaly threshold     │
│                    250                          │
│   ┌─────────────────────────────────────────┐   │
│   │ Augment the anomaly threshold with an   │   │
│   │         adaptive component with         │   │
│   │  $\epsilon_{ij}^{t+1} = \beta * \epsilon_0 + (1 - \beta) * \mu_{|t-w:t|}$   │
│   │                 252                     │   │
│   └─────────────────────────────────────────┘   │
│         ┌─────────────────────────────┐         │
│         │         Anomalies           │         │
│         │            157              │         │
│         └─────────────────────────────┘         │
└─────────────────────────────────────────────────┘
```

FIG. 2

DETECTION OF FALSE DATA INJECTION ATTACKS IN POWER SYSTEMS USING MULTIPLEX INVARIANT NETWORKS AND DOMAIN KNOWLEDGE

RELATED APPLICATION INFORMATION

This application claims priority to 62/572,006, filed on Oct. 13, 2017, and 62/615,980, filed on Jan. 11, 2018, incorporated herein by reference herein its entirety.

BACKGROUND

Technical Field

The present invention relates to power systems and more particularly detection of false data injection attacks on power systems.

Description of the Related Art

The power grid is a complex network consisting of multiple power generation, transmission and distribution components all interacting with each other to maintain the stability of the system in a large geographic area. The security and reliability of the power system has a significant impact on the smooth functioning of society.

To ensure data fidelity, bad data detection (BDD) techniques are employed by the control center to filter data before it is used for state estimation purposes. If, however, false measurements are able to circumvent the BDD layer, they could adversely affect the outcome of state estimation, thus misleading the automatic power grid control algorithms, resulting in catastrophic consequences such as brownouts or blackouts. The security of a system as complex as the modern electric grid is non-trivial to ensure as the large number of inter-dependent components render the system vulnerable to cyber-attacks. One such type of attack involves malicious entities manipulating data from devices like smart meters, being transmitted to the control center for state estimation. Essentially such an attack comprises of the attacker trying to inject an attack vector into a subset of devices they have successfully compromised that transmit diagnostic data to the control center. The effect of such an attack is that the control center receives data that is not representative of the true state of the components transmitting the data and hence such an attack is termed a False Data Injection Attack (FDIA).

SUMMARY

According to an aspect of the present invention, a computer-implemented method is provided for anomaly detection in a power system. The method includes receiving, by a processor-device, a plurality of measurements from a plurality of meters throughout the power system. The method also includes generating, by the processor-device, temporal causal networks based on pair-wise relationships between the plurality of measurements from the plurality of meters over time. The method additionally includes determining, by the processor-device, invariant relationships for the plurality of meters between the temporal causal networks. The method further includes predicting, by the processor-device, an anomaly from the invariant relationships for the plurality of meters with a residual anomaly threshold. The method also includes disabling one of the plurality of meters that originated the anomaly.

According to another aspect of the present invention, a computer program product is provided for anomaly detection in a power system. The computer program product includes a non-transitory computer readable storage medium having program instructions. The program instructions are executable by a computer to cause the computer to perform a method. The method includes receiving, by a processor-device, a plurality of measurements from a plurality of meters throughout the power system. The method also includes generating, by the processor-device, temporal causal networks based on pair-wise relationships between the plurality of measurements from the plurality of meters over time. The method additionally includes determining, by the processor-device, invariant relationships for the plurality of meters between the temporal causal networks. The method further includes predicting, by the processor-device, an anomaly from the invariant relationships for the plurality of meters with a residual anomaly threshold. The method also includes disabling one of the plurality of meters that originated the anomaly.

According to another aspect of the present invention, energy management system with anomaly detection is provided. The energy management system includes a processing system having a processor and memory coupled to the processor. The processing system is programmed to receive a plurality of measurements from a plurality of meters throughout the power system. The processing system is also programmed to generate temporal causal networks based on pair-wise relationships between the plurality of measurements from the plurality of meters over time. The processing system is additionally programmed to determine invariant relationships for the plurality of meters between the temporal causal networks. The processing system is further programmed to predict an anomaly from the invariant relationships for the plurality of meters with a residual anomaly threshold. The processing system is also programmed to disable one of the plurality of meters that originated the anomaly.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 2 is a block/flow diagram illustrating anomaly detection method with a Granger causality based Kalman filter with adaptive robust thresholding, in accordance with the present invention;

DETAILED DESCRIPTION OF PREFERRED EMBODIMENTS

An Energy Management System (EMS) is provided that includes a Granger Causality based Kalman Filter with Adaptive Robust Thresholding (GKART) system that can address the problem of false data injection attacks by leveraging latent functional relationships between the components in a power system that may not necessarily be represented by explicit power flow equations. By using data-driven learning techniques for state estimation, a wider array of component-level relationships can be modeled at any given time because the pair-wise data driven invariant learning is not restricted to learning relationships only between components that are directly connected in the power system topology.

Figure 1:
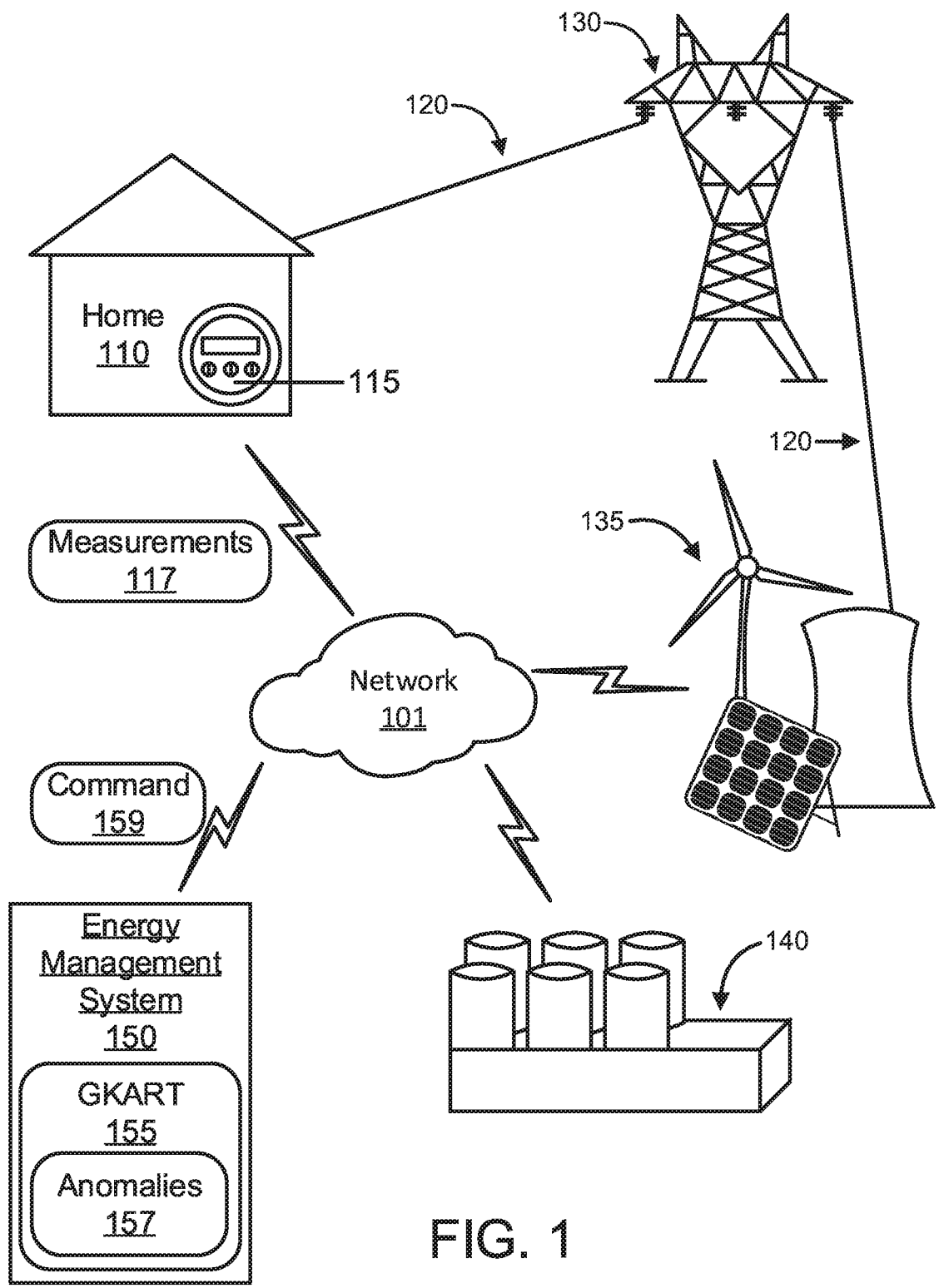
FIG. 1 is a high-level environment diagram illustrating a power system, in accordance with the present invention.

Referring now in detail to the figures in which like numerals represent the same or similar elements and initially to FIG. 1, a high-level environment diagram of a power system 100 is illustratively depicted in accordance with one embodiment of the present invention.

The power system 100 can be defined as a complex network consisting of generation centers 135, transmission towers 130, transmission lines 120, transformers, and end users connected by a communication network 101. The generation centers 135 can include, e.g., solar farms, wind farms, nuclear plants, coal plants, natural gas plants, etc. End users can include business customers or residential homes 110. A control center 140 can be employed to monitor and control the various operations of devices in the power system 100. The business customers and residential homes 110 can include a meter 115 that can send information over the communication network 101 back to the control center 140.

Each component in the power system 100 can include a meter 115 that can send information back to the control center 140. The control center 140 can include an EMS 150 that utilizes a GKART system 155 for anomaly 157 detection. The command center 140 or the GKART system 155 can send a command 159 to the power system 100 to alter how the power system 100 functions responsive to anomalies 157 detected. The communication network 101 can include a WIFI or equivalent radio system, a cellular based system, a local area network (LAN), hardwired system, etc. The information sent to the control center 140 can include measurements 117. The measurements 117 can include, e.g., active power, reactive power, up-time, usage information, etc.

The power system 100 can include a matrix termed the Jacobian, shown as $H \in R^{m \times n}$, that is constructed depending on transmission line 120 impedances and the network topology of a power system 100. The Jacobian matrix can be used to estimate the values of phase angles and voltages of the buses from the active and reactive power measurement values respectively. The Jacobian, H, is in a space R defined by the variable m, which represents the number of meters 115 providing measurements of active power P or reactive power Q flowing from $(P_f, Q_f)$ or to $(P_t, Q_t)$ a bus, and n which represents the number of state variables to be estimated.

An attacker can comprise the Jacobian matrix in an FDIA and get complete access to the Jacobian matrix. This can be a goal of the attack because the Jacobian matrix is used to estimate the values of phase angles and voltages of the buses from the active and reactive power measurement values. Naturally, if an attacker were to inject false values at certain points in the active or reactive power readings before they were recorded at the control center 140, the subsequent estimates of voltage and phase angle would be affected. This process of false data injection could be used by the attacker to destabilize the power system 100 or to govern how certain processes occur in the power system 100, like buying power from outside producers or selling excess power.

When Bad Data Detection (BDD) methods are only based on system topology and weighted least squares procedures, as is the case with BDD in traditional power systems, it would be relatively simple for the attacker (who now has an inherent understanding of the line and component properties) to launch an attack that would be stealthy and pass the BDD procedure.

The GKART system 155 can learn statistically significant predictive causal relationships between any pair of components in the power system 100 through an inductive learning procedure. The state of each component is modeled in the power system 100 as an aggregation of individual pairwise functional relationships learned between said component and other components of the network using the meter 115 measurements 117 obtained from the component. This aggregation of relationships can be considered a multiplex network wherein each layer of the network consists of the same set of power system components which are potentially connected in different ways because each network measures different metrics (e.g., active power flowing from a bus, active power flowing to a bus, reactive power flowing from a bus, reactive power flowing to a bus) and hence the invariant relationships between the same pair of nodes across different networks are semantically and functionally different. Each network layer in the multiplex network can be considered to be related by domain knowledge-based rules such as power flow equations between components or branch loss relationships between two components connected via a branch.

The GKART system 155 can employ a temporal causal network learning based approach to detect Stealthy FDIA (SFDIA) in the power system 100. The GKART system 155 can deploy a robust adaptive thresholding procedure to accommodate for effective anomaly detection even in the context of noisy training data laden with outliers and gradual data distribution changes. Further, the GKART system 155 can augment an invariant learning approach by governing the approach with a Granger Causality F-test to learn only statistically significant causal relationships and eliminate the need for manual thresholding. The F-test however is flexible enough to accept lag values and significance levels if a user wishes to specify them but can return an invariant network without either of these specified.

To ensure resilient operation of the power system 100 even when some components fail, power engineers can employ meters 115 to monitor different parts of the network and collect their readings at the control center 140. These meter 115 measurements 117 (active power P, and reactive power Q) recorded at each bus are used to estimate the states of power system variables (voltage V and phase angle θ) of the buses in the power system 100.

If the set of n state variables are defined as $x=\{x_1, x_2, \ldots, x_n\}$ and the m bus measurements recorded by the meters are defined as $z=\{z_1, z_2, \ldots, z_m\}$, the goal of the state estimation problem is to estimate the values of the vector of state variables x using the measurements z. If the Jacobian matrix is represented as H, and measurement errors are defined by $e=\{e_1, e_2, \ldots, e_m\}$, then the state estimation problem can be defined as in equation 1 wherein the goal is essentially to find a vector $\hat{x}$ that is a good approximation of the vector of state estimates x.

$$z = H\hat{x} + e \tag{1}$$

If measurement noise is assumed to be normally distributed with zero mean, then equation 2 represents the solution to the state estimation problem. Here, the matrix $W \in R^{m \times m}$ is a diagonal matrix where each entry $w_{ii}$ is a reciprocal of the variance of meter error of meter i.

$$\hat{x} = (H^T W H)^{-1} H^T W_z \qquad (2)$$

The $L_2$ norm of the measurement residual $\|z-H\hat{x}\|_2$ can be a bad data detection procedure. Essentially if $\|z-H\hat{x}\|_2 > \tau$ for some expert defined threshold, the BDD procedure indicates the presence of bad measurements.

For the power system 100 with m measurements and n state estimates, the measurements and estimates are related through the Jacobian matrix $H \in R^{m \times m}$. The attacker can have complete knowledge of the composition of matrix H. This can be obtained by compromising the control center network 140 or through social engineering or other such approaches. A scenario of random FDIA, in which the goal of the attacker is to generate a random attack vector $a \in R^{k \times 1}$ for any subset of k compromised meters to cause a wrong state estimation of state variables at the control center 140. For ease of notation, assume $\alpha \in R^{m \times 1}$ for a subset of k compromised meters 115 where values at all m−k indices of uncompromised meters 115 are 0 in $\alpha$. If $z_\alpha = z + \alpha$ then it has been shown that any vector $\alpha$ can be injected into measurements to circumvent the $L_2$-norm based BDD procedures as long as $\alpha = Hc$ where c is any arbitrary nonzero vector. Essentially, attack vector $\alpha$ is a linear transformation of H.

In contrast to the $L_2$-norm based BDD approach where the matrix H is used, the GKART system 155 ignores H and instead focuses on learning purely data-driven functional relationships between the various components in the power system 100 as an invariant graph.

The GKART system 155 ignores the system topology and properties to a certain extent and hence the attacker now only has partial information (as he only has access to the Jacobian matrix H of the system and is unaware of the functional relationships learnt by the invariant network. Any component in the network could essentially be connected to any other component in the network through a functional relationship. So, to launch a successful attack, the attacker must on average compromise more components for the FDIA to remain undetected. The aforementioned effects ensure that the FDIA is no longer always stealthy and even if a stealthy attack is launched, the invariant network significantly increases the average cost of the attacker to launch successful stealthy FDIA.

Referring now to FIG. 2, a method 200 for anomaly detection with a Granger causality based Kalman filter with adaptive robust thresholding is illustratively depicted in accordance with an embodiment of the present invention.

The power system 100 can have a set of n time series $S = \{X_1, \ldots, X_n\}$ where each $X_i$ represents a sensor at bus i measuring a particular metric like active-power flowing out from bus i ($P_{fi}$) in the power system 100. $X_i^t$ represents a measurement 117 recorded at a particular bus i at time t. Each component in the power system 100 can be affected either directly or indirectly by the other components.

Modeling pair-wise component relationships 210 in sensor networks can be useful in anomaly detection tasks in the power system 100. The pair-wise component relationships can be modeled as temporal causal networks. Learning, temporal predictive causality is a popular concept in many fields like biology, social science and climate science. Although many approaches based on randomization, cross-correlation etc., the GKART system 155 adopts a regression-based method for uncovering temporal causality called Granger Causality for construction of the causality graph 212.

The basic idea of Granger Causality states that a variable $X_j$ is the cause of another variable $X_i$ if the past values of $X_j$ are helpful in predicting the future values of $X_i$. Consider two autoregressions as expressed in equations 3 and 4:

$$X_i^t = \sum_{l=1}^{L} a^l X_i^{t-1} \qquad (3)$$

$$X_i^t = \sum_{l=1}^{L} a^l X_i^{t-1} + b^l X_j^{t-1} \qquad (4)$$

with L being the maximum time lag, $\alpha$ being a variable that is learned during training, and b being a variable that is learned during training. $X_j$ is said to Granger cause $X_i$ if the predictions of equation 4 are significantly better than predictions of $X_i$ by equation 3. In other words, the past values of $X_j$ along with the past values of $X_i$ can be utilized for the future predictions of $X_i$ if the predictions utilizing the past values of $X_j$ are better than predictions utilizing past values of $X_i$ alone.

For each pair of time series in S, the F-test can be utilized to determine statistical significance wherein if the null hypothesis ($X_j$ does not cause $X_i$) is discounted with a confidence level of higher than $\alpha$, then $X_j$ has a relationship of predictive causality with $X_i$ 222 denoted by a directed edge from $X_j$ to $X_i$ in the temporal causal network 220 (a.k.a invariant network). Here, $\alpha$ usually called the significance level indicates the probability of type 1 errors, e.g., the probability of wrongly indicating that $X_j$ causes $X_i$. The significance level can be set to retain only strong relationships of temporal causality, e.g., $\alpha = 0.01$.

The temporal causal network learning procedure culminates yielding a graph G=(V, E) wherein an edge $e_{ij} \in E$ from node $v_i$ to $v_j | \{v_i, v_j\} \in V$ indicates that time series $X_i$ has a temporal causal effect on time series $X_j$.

Temporal Causal Network Learning

```
Input: S = {X_1,..., X_n}: Input time series,
  α: Type 1 Error significance level bound,
  L: Maximum Time Lag,
  t_s: Training Period Start,
  t_e: Training Period End
Output: G : Temporal Causality Network
  1  G = Initialize Empty Graph;
  2  for i = 1 to n do
  3      for j= 1 to n do
  4          //Check if i causes j;
  5          res_ij = GrangerCausality(X_j^{ts:te}, X_i^{ts:te}, L);
  6          if F − Test(res_ij, α) is Causal then
  7              G = G ∪ {e_ji};
  8          end
  9          // Check if j causes i;
 10          res_ji = GrangerCausality(X_i^{ts:te}, X_j^{ts:te}, L);
 11          if F − Test(res_ji, α) is Causal then
 12              G = G ∪ {e_ji};
 13          end
 14      end
 15  end
```

Once the temporal causal network G=(V, E) is learned 220, each predictive causal relationship $e_{ij} \in E$ in G is modeled with a Kalman Filter. Each node $v_j \in V$ represents a bus in the original power system and has a set of k Kalman filters monitoring its state at each time step where k represents the number of incoming edges (temporal causal relationships) that node $v_j$ is involved in. A Kalman filter $K_{ij}$ represents the model monitoring the state of node $v_j$ at each time step, using the historical data from $X_i$, $X_j$. In addition to pairwise data, the GKART system 155 can include non-linear system states incorporated through a deep robust autoencoder mechanism 230.

$$\hat{X}_{ij}^t = \alpha_i X_{ij}^{t-1} + \alpha_j X_{ji}^{t-1} + a_k X_{em}^{t-1} + \in \quad (5)$$

The predictions of model $K_{ij}$ at each time step t can be calculated 240 according to equation 5. Here, the predicted state of the measurement at bus j at time t is represented by $\hat{X}_{ij}^t$. $\in$ represents the prediction error and can be assumed to be normally distributed. $X_{ij}^{t-1}$ and $X_{jt}^{t-1}$ are state estimates for the states of $X_j$, $X_i$ respectively at time t−1 and $X_{em}^{t-1} \in R^{|em|\times 1}$ is a vector of the embedding returned by the auto-encoder mechanism of the system-wide measurement vector at time t−1. The weights $A=[\alpha_i, \alpha_j, a_k]$ are estimated from a subset of the data using expectation maximization.

If $\hat{X}_{ij}^t$ and $\overline{X}_j^t$ represent the predicted and actual values respectively of $bus_j$ at time t, a particular invariant relationship $e_{ij} \in G$, $e_{ij}$ is said to be broken if equation 6 is violated.

$$|\overline{X}_j^t - \hat{X}_{ij}^t| < \in_{ij}^0 \quad (6)$$

This residual based anomaly threshold can be adopted 250 in an effort to reduce false positive rates of broken invariant relationships in the graph G during testing. $\in_0$ can be estimated from the residuals in the training phase to be 10% larger than the tolerance of residuals as given by equation 7.

$$\in_{ij}^0 = 1.1 * \arg_r \{Prob(|\overline{X}_j^t - \hat{X}_{ij}^t|) < 0.995\} \quad (7)$$

Bi-Variate Temporal Causality Model Training

---

Input: $S = \{X_1,..., X_n\}$: Input time series,
    $t_s$: Training Period Start,
    $t_e$: Training Period End,
    G = (V, E): Temporal Causality Inv. Network
Output: K: Temporal Causality Model Matrix
1  K = { };
2  for $e_{ij} \in$ E do
3    // Fit Kalman Filter using $X_j$ and $X_i$ to estimate state of $bus_j$ ;
4    $K_{ij}$ = KalmanFilter($X_i^{ts:te}$, $\hat{X}_j^{ts:te}$) ;
5    K = K ∪ $K_{ij}$ ;
6  end

---

In the context of FDIA, the assumption that the training data is free of a significant portion of outliers is not a sound assumption to make. Hence, data laden with noise is employed both for training and testing since the models and thresholds learned need to be robust. Unfortunately, the thresholding methodology in equation 7 can be susceptible to yielding an overestimated anomaly threshold as it is sensitive to noise and outliers.

The GKART system 155 augments the learned thresholding procedure with an adaptive component 252 in the testing phase as outlined in equation 8.

$$\in_{ij}^{t+1} = \beta * \in_0 + (1-\beta) * \mu_{|t-w:t|} \quad (8)$$

$\in_{ij}^{t+1}$ represents the adaptive anomaly threshold for time step t+1 for relationship $e_{ij}$ in the temporal causal graph G, with β being a constant. The adaptive threshold is a convex combination of the constant residual based anomaly threshold learned during the training phase and the term $\mu_{|t-w:t|}$ which is a rolling window based median of the residuals in the past window of size w. This new procedure is capable of yielding good performance even with noisy data by adapting the anomaly threshold to underlying changes in the data distribution to detect anomalies 157. The procedure is robust due to the inclusion of the adaptive median thresholding component as the median is known to be a robust statistic.

Equation 9 represents a modified version of equation 6 in the context of adaptive thresholding.

$$|\overline{X}_j^t - \hat{X}_{ij}^t| < \in_{ij}^t \quad (9)$$

Consider a bus i in the power system that has k temporal causal relationships (incoming edges) monitoring its state. This signifies that there are k Kalman filter models ($K_{*i}$) offering predictions for the state of bus i at each time step t. Each of these models has a concomitant value for the adaptive anomaly threshold which along with the actual measurement at i at time t is used to determine whether or not the edge $e_{ji}$ is broken for each of the k invariants. If greater than 50% of the invariants of $bus_i$ are broken, a FDIA can be said to have occurred at $bus_i$ at time t and an alert can be sent out.

This is similar to a majority voting paradigm in ensemble modeling. Hence, the state estimation and anomaly detection framework might be considered for each bus in the power system, as a majority voting-based ensemble model that sends out alerts if a majority of the temporal causal relationships of a particular bus are broken at a particular time step.

Ensemble Anomaly Detection & Alerting

---

Input: $S = \{X_1,..., X_n\}$: Input time series,
    $t_e$: Testing Period Start,
    $t_{end}$: Testing Period End,
    ξ = 0.5: Alert Threshold,
    G = (V,E): Temporal Causality Network,
    K: Temporal Causality Model Matrix
1  foreach t | $t_e$ < t < $t_{end}$ do
2    foreach $v_j \in$ G.nodes( ) do
3      votes=0;
4      // Iterate over all incoming edges of $v_j$ ;
5      foreach $e_{ij} \in$ G.neighbors($v_j$) do
6        $\hat{X}_{ij}^t = K_{ij}$.predict($\overline{X}_i^{t-1}, \overline{X}_j^{t-1}$);
7        $\epsilon_{ij}^t$ = Calc. adaptive threshold using eq. 8;
8        if $|\overline{X}_j^t - \overline{X}_{ij}^t| > \epsilon_{ij}^t$ then
9          votes+=1
10      end
11    end
12    $score_j = \dfrac{votes}{|G.neighbors(v_j)|}$;
13    if $score_j \geq$ ξ then
14      Invoke Alert: FDI at $v_j$ at time step t;
15    end
16  end
17  end

---

The GKART system 155 described incorporates the Granger causality based invariant learning to model the power of predictive causality of different components in the power system 100. The GKART system 155 augments the anomaly detection procedure in the EMS 150 with a robust adaptive thresholding mechanism.

Multiple Kalman filter models can be trained to monitor the state of each bus in the power system 100, and the training process is governed by a Granger Invariant Network, e.g., for each directed edge (from a source node to a sink node) in the invariant network, a Kalman Filter can be trained to predict the state of the sink node at the next time step, given historical data from the sink and the source nodes. At the end of the training process, a node with n invariant relationships essentially has an ensemble of n different Kalman filters monitoring the nodes state at each time step.

At any time step, if the error in state prediction of an invariant model is greater than a pre-calculated threshold, the invariant edge between the two nodes in question can be said to be broken/invalidated. One of the n models in the ensemble for the sink node can predict that an anomaly has occurred at the current time step in the sink node. If a majority (>50%) of the bivariate invariant relationships for a particular node in the system are invalidated, the component has experienced an anomaly. A majority-voting ensemble model can be employed for anomaly detection at each bus.

Figure 3:
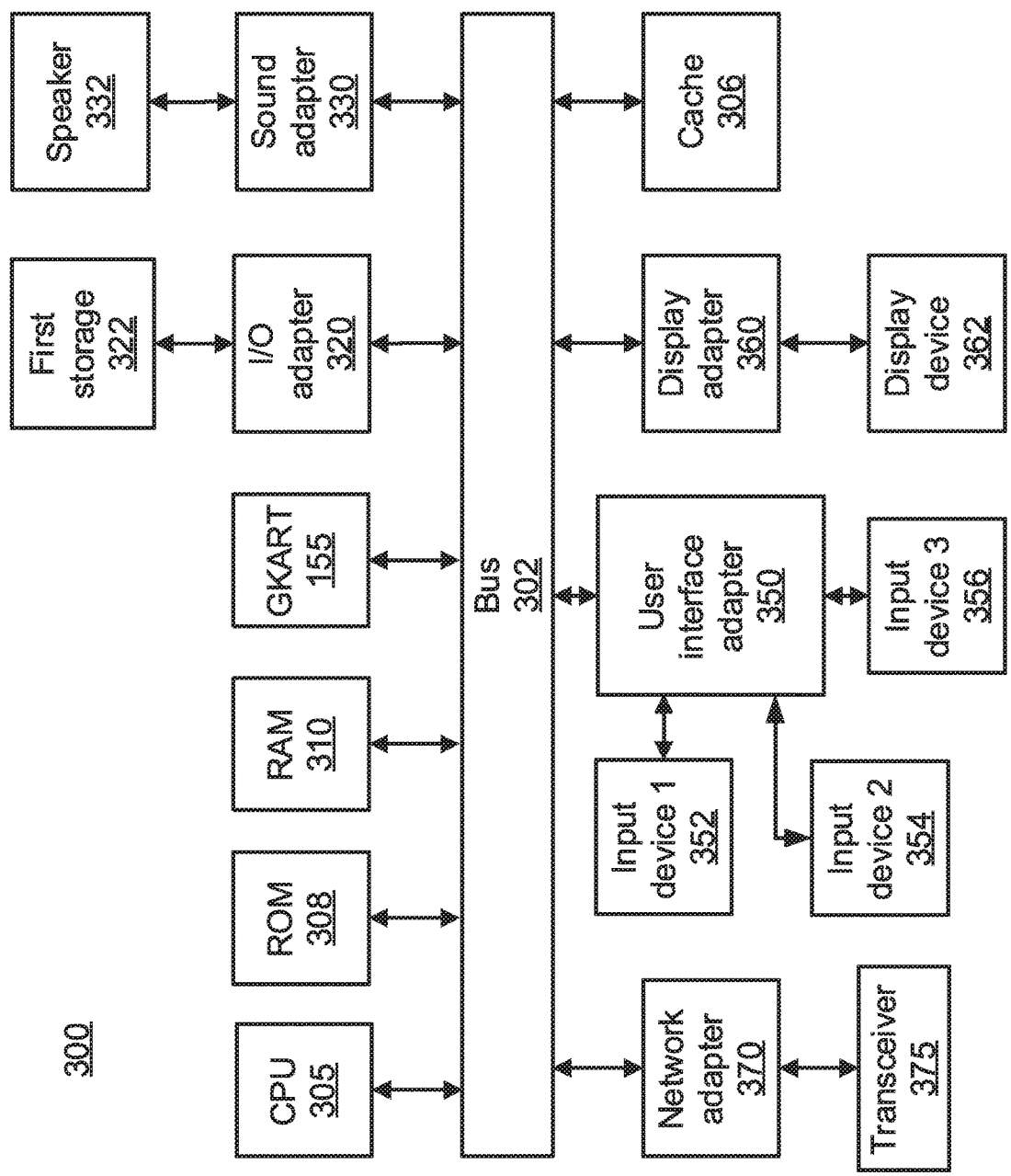
FIG. 3 is a block diagram illustrating a processing system, in accordance with an embodiment of the present invention.

Referring to FIG. 3, an exemplary processing system 300 is shown which may represent a server or a network device, in accordance with an embodiment of the present invention. The processing system 300 includes at least one processor (CPU) 305 operatively coupled to other components via a system bus 302. The processing system 300 includes the GKART system 155 operatively coupled to the other components via the system bus 302. A cache 306, a Read Only Memory (ROM) 308, a Random Access Memory (RAM) 310, an input/output (I/O) adapter 320, a sound adapter 330, a network adapter 370, a user interface adapter 350, and a display adapter 360, are operatively coupled to the system bus 302.

A first storage device 322 is operatively coupled to system bus 302 by the I/O adapter 320. The storage device 322 can be any of a disk storage device (e.g., a magnetic or optical disk storage device), a solid state magnetic device, and so forth.

A speaker 332 may be operatively coupled to system bus 302 by the sound adapter 330. A transceiver 375 is operatively coupled to system bus 302 by network adapter 370. A display device 362 is operatively coupled to system bus 302 by display adapter 360.

A first user input device 352, a second user input device 354, and a third user input device 356 are operatively coupled to system bus 302 by user interface adapter 350. The user input devices 352, 354, and 356 can be any of a sensor, a keyboard, a mouse, a keypad, a joystick, an image capture device, a motion sensing device, a power measurement device, a microphone, a device incorporating the functionality of at least two of the preceding devices, and so forth. Of course, other types of input devices can also be used. The user input devices 352, 354, and 356 can be the same type of user input device or different types of user input devices. The user input devices 352, 354, and 356 are used to input and output information to and from system 300.

The GKART system 155 can detect anomalies 157 from the measurements 117 produced by the power system 100. The anomalies 157 can predict an intrusion into the power system 100 from an attacker that is attempting to damage the power system 100 or alter how the power system 100 is functioning. The GKART system 155 can send the command 159 to the command center 140 to isolate the meter 150 that is broadcasting the false measurement and remove the meter 150 from the Jacobian matrix until the meter 150 can be cleared as being attacker free. The GKART system 155 can send the command 159 to the power system 100 to bring generation centers 135 online or to take generation centers 135 offline when the false measurements caused generation centers 135 to change state.

Of course, the processing system 300 may also include other elements (not shown), as readily contemplated by one of skill in the art, as well as omit certain elements. For example, various other input devices and/or output devices can be included in processing system 300, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 300 are readily contemplated by one of ordinary skill in the art given the teachings of the present invention provided herein.

Moreover, it is to be appreciated that environment 100 described above with respect to FIG. 1 is an environment for implementing respective embodiments of the present invention. Part or all of processing system 300 may be implemented in one or more of the elements of environment 100.

Figure 4:
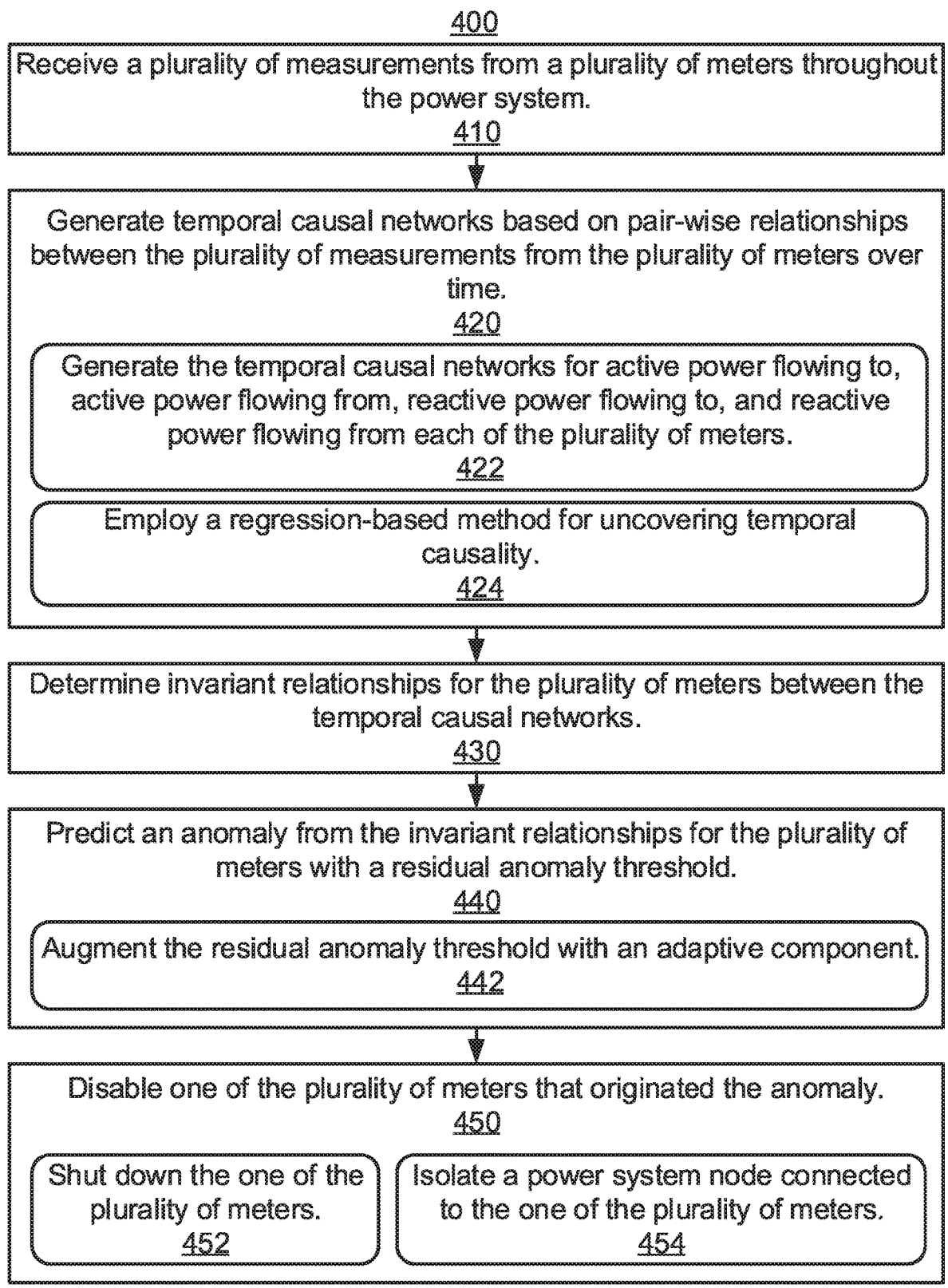
FIG. 4 is a flow diagram illustrating a method for anomaly detection in a power system, in accordance with an embodiment of the present invention.

Further, it is to be appreciated that processing system 300 may perform at least part of the method described herein including, for example, at least part of method 200 of FIG. 2 and/or at least part of method 400 of FIG. 4.

Referring to FIG. 4, a flow chart for an anomaly detection method 400 in a power system is illustratively shown, in accordance with an embodiment of the present invention. In block 410, a plurality of measurements are received from a plurality of meters throughout the power system. In block 420, temporal causal networks are generated based on pair-wise relationships between the plurality of measurements from the plurality of meters over time. In block 422, the temporal causal networks are generated for active power flowing to, active power flowing from, reactive power flowing to, and reactive power flowing from each of the plurality of meters. In block 424, a regression-based method is employed for uncovering temporal causality. In block 430, invariant relationships are determined for the plurality of meters between the temporal causal networks. In block 440, an anomaly is predicted from the invariant relationships for the plurality of meters with a residual anomaly threshold. In block 442, the residual anomaly threshold is augmented with an adaptive component. In block 450, one of the plurality of meters that originated the anomaly is disabled. In block 452, the one of the plurality of meters is shut down. In block 454, a power system node connected to the one of the plurality of meters is isolated.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable storage medium such as a semiconductor or solid state memory, magnetic tape, a removable computer diskette, a random access memory (RAM), a read-only memory (ROM), a rigid magnetic disk and an optical disk, etc.

Each computer program may be tangibly stored in a machine-readable storage media or device (e.g., program memory or magnetic disk) readable by a general or special purpose programmable computer, for configuring and controlling operation of a computer when the storage media or device is read by the computer to perform the procedures described herein. The inventive system may also be considered to be embodied in a computer-readable storage medium, configured with a computer program, where the storage medium so configured causes a computer to operate in a specific and predefined manner to perform the functions described herein.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the present invention and that those skilled in the art may implement various modifications without departing from the scope and spirit of the invention. Those skilled in the art could implement various other feature combinations without departing from the scope and spirit of the invention. Having thus described aspects of the invention, with the details and particularity required by the patent laws, what is claimed and desired protected by Letters Patent is set forth in the appended claims.

What is claimed is:

1. A computer-implemented method for anomaly detection in a power system, the method comprising:
    receiving, by a processor-device, a plurality of measurements from a plurality of meters throughout the power system;
    generating, by the processor-device, temporal causal networks based on pair-wise relationships between the plurality of measurements from the plurality of meters over time;
    determining, by the processor-device, invariant relationships for the plurality of meters between the temporal causal networks;
    predicting, by the processor-device, an anomaly from the invariant relationships for the plurality of meters with a residual anomaly threshold; and
    disabling one of the plurality of meters that originated the anomaly.

2. The computer-implemented method as recited in claim 1, wherein disabling includes shutting down the one of the plurality of meters or isolating a power system node connected to the one of the plurality of meters.

3. The computer-implemented method as recited in claim 2, wherein the power system node can be selected from the group consisting of a generation center, a generation center sub-system, a transformer, a transmission line, and a transmission tower.

4. The computer-implemented method as recited in claim 1, wherein generating includes generating the temporal causal networks for active power flowing to each of the plurality of meters, active power flowing from each of the plurality of meters, reactive power flowing to each of the plurality of meters, and reactive power flowing from each of the plurality of meters.

5. The computer-implemented method as recited in claim 1, wherein generating includes incorporating non-linear system states through a deep robust autoencoder mechanism.

6. The computer-implemented method as recited in claim 1, wherein determining includes employing Kalman filters on the temporal causal networks.

7. The computer-implemented method as recited in claim 6, wherein employing includes modeling a state of each of the plurality of meters over time.

8. The computer-implemented method as recited in claim 1, wherein predicting includes augmenting the residual anomaly threshold with an adaptive component.

9. The computer-implemented method as recited in claim 1, wherein generating includes employing a regression-based method for uncovering temporal causality.

10. A computer program product for anomaly detection in a power system, the computer program product comprising a non-transitory computer readable storage medium having program instructions embodied therewith, the program instructions executable by a computer to cause the computer to perform a method comprising:
    receiving, by a processor-device, a plurality of measurements from a plurality of meters throughout the power system;
    generating, by the processor-device, temporal causal networks based on pair-wise relationships between the plurality of measurements from the plurality of meters over time;
    determining, by the processor-device, invariant relationships for the plurality of meters between the temporal causal networks;
    predicting, by the processor-device, an anomaly from the invariant relationships for the plurality of meters with a residual anomaly threshold; and
    disabling one of the plurality of meters that originated the anomaly.

11. The computer-implemented method as recited in claim 10, wherein generating includes incorporating non-linear system states through a deep robust autoencoder mechanism.

12. An energy management system with anomaly detection, the energy management system comprising:
    a processing system including a processor and memory coupled to the processor, the processing system programmed to:
        receive a plurality of measurements from a plurality of meters throughout the power system;
        generate temporal causal networks based on pair-wise relationships between the plurality of measurements from the plurality of meters over time;
        determine invariant relationships for the plurality of meters between the temporal causal networks;
        predict an anomaly from the invariant relationships for the plurality of meters with a residual anomaly threshold; and
        disable one of the plurality of meters that originated the anomaly.

13. The energy management system as recited in claim 12, wherein the processing system is further programmed to shut down the one of the plurality of meters or isolate a power system node connected to the one of the plurality of meters.

14. The energy management system as recited in claim 13, wherein the power system node can be selected from the group consisting of a generation center, a generation center sub-system, a transformer, a transmission line, and a transmission tower.

15. The energy management system as recited in claim 12, wherein the processing system is further programmed to generate the temporal causal networks for active power flowing to each of the plurality of meters, active power flowing from each of the plurality of meters, reactive power flowing to each of the plurality of meters, and reactive power flowing from each of the plurality of meters.

16. The energy management system as recited in claim 12, wherein the processing system is further programmed to incorporate non-linear system states through a deep robust autoencoder mechanism.

17. The energy management system as recited in claim 12, wherein the processing system is further programmed to employ Kalman filters on the temporal causal networks.

18. The energy management system as recited in claim 17, wherein the processing system is further programmed to model a state of each of the plurality of meters over time.

19. The energy management system as recited in claim 12, wherein the processing system is further programmed to augment the residual anomaly threshold with an adaptive component.

20. The energy management system as recited in claim 12, wherein the processing system is further programmed to employ a regression-based method for uncovering temporal causality.

* * * * *